(12) United States Patent
Gong et al.

(10) Patent No.: US 12,051,745 B2
(45) Date of Patent: Jul. 30, 2024

(54) MANUFACTURING METHOD OF A SEMICONDUCTOR DEVICE

(71) Applicant: SUZHOU ORIENTAL SEMICONDUCTOR CO., LTD., Jiangsu (CN)

(72) Inventors: Yi Gong, Jiangsu (CN); Wei Liu, Jiangsu (CN); Zhendong Mao, Jiangsu (CN); Zhenyi Xu, Jiangsu (CN)

(73) Assignee: SUZHOU ORIENTAL SEMICONDUCTOR CO., LTD., Jiangsu (CN)

( * ) Notice: Subject to any disclaimer, the term of this patent is extended or adjusted under 35 U.S.C. 154(b) by 0 days.

(21) Appl. No.: 17/614,253

(22) PCT Filed: Nov. 20, 2020

(86) PCT No.: PCT/CN2020/130600
§ 371 (c)(1),
(2) Date: Nov. 24, 2021

(87) PCT Pub. No.: WO2022/099765
PCT Pub. Date: May 19, 2022

(65) Prior Publication Data
US 2023/0268432 A1 Aug. 24, 2023

(30) Foreign Application Priority Data
Nov. 16, 2020 (CN) .......................... 202011280137.9

(51) Int. Cl.
*H01L 29/78* (2006.01)
*H01L 21/04* (2006.01)
(Continued)

(52) U.S. Cl.
CPC ........ *H01L 29/7813* (2013.01); *H01L 21/046* (2013.01); *H01L 29/1608* (2013.01);
(Continued)

(58) Field of Classification Search
CPC .............. H01L 21/046; H01L 21/7813; H01L 21/1608; H01L 21/4236; H01L 21/66068; H01L 21/66734
(Continued)

(56) References Cited

U.S. PATENT DOCUMENTS

2013/0306983 A1* 11/2013 Nakano ................. H01L 27/088
438/270
2013/0313576 A1* 11/2013 Nakano ............... H01L 29/1095
257/77
2020/0144412 A1 5/2020 Ohashi et al.

FOREIGN PATENT DOCUMENTS

| CN | 110637374 | 12/2019 |
| CN | 111403487 | 7/2020 |

(Continued)

OTHER PUBLICATIONS

PCT/CN2020/130600 International Search Report dated Aug. 9, 2021.

*Primary Examiner* — Igwe U Anya
(74) *Attorney, Agent, or Firm* — Michael Best & Friedrich LLP

(57) ABSTRACT

A gate trench and a source trench are formed simultaneously in the same etching process, a p-type semiconductor layer and a p-type doped region can be contacted in a self-aligned manner in the source trench, and the process is simple. A first insulating layer and a first gate are formed in a lower part of the gate trench, and a second insulating layer and a second gate are formed in an upper part of the gate trench so that the thick first insulating layer can protect the second gate from being easily broken down, the first gate can increase an electric field near a bottom of the gate trench, and thus a voltage withstand level of the semiconductor device can be (Continued)

improved. A bottom of the source trench can penetrate deep into a second n-type semiconductor layer.

10 Claims, 4 Drawing Sheets

(51) Int. Cl.
*H01L 29/16* (2006.01)
*H01L 29/423* (2006.01)
*H01L 29/66* (2006.01)

(52) U.S. Cl.
CPC .... *H01L 29/4236* (2013.01); *H01L 29/66068* (2013.01); *H01L 29/66734* (2013.01)

(58) Field of Classification Search
USPC .......................................................... 257/330
See application file for complete search history.

(56) References Cited

FOREIGN PATENT DOCUMENTS

| CN | 111755521 | 10/2020 |
| CN | 111933710 | 11/2020 |

\* cited by examiner

MANUFACTURING METHOD OF A SEMICONDUCTOR DEVICE

CROSS REFERENCE TO RELATED APPLICATION

This is a national stage application filed under 37 U.S.C. 371 based on International Patent Application No. PCT/CN2020/130600, filed Nov. 20, 2020, which claims priority to Chinese Patent Application No. 202011280137.9 filed Nov. 16, 2020, the disclosures of which are incorporated herein by reference in their entireties.

TECHNICAL FIELD

The present application belongs to the technical field of semiconductor devices, for example, relates to a manufacturing method of a semiconductor device.

BACKGROUND

Silicon carbide has many characteristics that are different from traditional silicon semiconductor materials. The band gap of silicon carbide is 2.8 times that of silicon, and the insulation breakdown field strength of silicon carbide is 5.3 times that of silicon. Therefore, in a field of high-voltage power devices, compared with silicon materials, a thinner epitaxial layer may be used in a silicon carbide device so that while the silicon carbide device has the same voltage withstand level as a traditional silicon device, the silicon carbide device has a lower on-resistance. At present, the main problem of using silicon carbide to prepare trench power device is that a large electric field is applied to a gate dielectric layer in a gate trench when the trench power device is in operation so that the gate is easily broken down and thus a voltage withstand level of the trench power device is affected.

SUMMARY

The present application provides a manufacturing method of a semiconductor device so that a risk of breakdown of a gate of the semiconductor device can be reduced and a voltage withstand level of the semiconductor device can be improved.

The present application provides a manufacturing method of a semiconductor device. The method includes steps described below.

A semiconductor substrate is provided, where the semiconductor substrate includes a first n-type semiconductor layer, a second n-type semiconductor layer, a p-type semiconductor layer and a third n-type semiconductor layer, and the first n-type semiconductor layer, the second n-type semiconductor layer, the p-type semiconductor layer and the third n-type semiconductor layer which are stacked in turn.

Photolithography and etching are performed so that a gate trench and a source trench are formed simultaneously in the semiconductor substrate, where the gate trench and the source trench are alternately spaced apart, a bottom of the gate trench and a bottom of the source trench are both disposed in the second n-type semiconductor layer, and a width of the source trench is greater than a width of the gate trench.

A first insulating layer covering an inner wall of the gate trench and covering an inner wall of the source trench is formed.

A first conductive layer is formed and etched back, where a remaining first conductive layer after etching forms a first gate in the gate trench.

Anisotropic etching is performed on the first insulating layer so that the second n-type semiconductor layer under the source trench is exposed.

P-type ion implantation is performed so that a p-type doped region under the source trench is formed in the second n-type semiconductor layer.

The first insulating layer in the gate trench is etched so that an upper surface of the first insulating layer in the gate trench is not higher than a lower surface of the p-type semiconductor layer.

A second insulating layer is formed and etched so that a part of the second insulating layer is removed, where the part of the second insulating layer is disposed in the source trench.

A second conductive layer is formed and etched so that a remaining part of the second conductive layer after etching forms a second gate in the gate trench and forms a source in the source trench.

In an embodiment of the present application, the first n-type semiconductor layer, the second n-type semiconductor layer, the p-type semiconductor layer and the third n-type semiconductor layer are all silicon carbide layers.

In an embodiment of the present application, when the first conductive layer is formed, the first conductive layer fills the gate trench but not the source trench.

In an embodiment of the present application, the first gate in the gate trench is etched off before the second insulating layer is formed.

In an embodiment of the present application, after the part of the second insulating layer in the source trench is removed, the anisotropic etching is performed on the first insulating layer in the source trench so that the p-type semiconductor layer is exposed at a sidewall position of the source trench.

In an embodiment of the present application, a thickness of the first insulating layer is greater than a thickness of the second insulating layer.

In an embodiment of the present application, a material of the first insulating layer is silicon oxide.

In an embodiment of the present application, a material of the second insulating layer is at least one of silicon oxide, silicon nitride, silicon oxynitride or hafnium oxide.

In an embodiment of the present application, a material of the first insulating layer is conductive polysilicon.

In an embodiment of the present application, a material of the second conductive layer is at least one of titanium, nickel, copper, aluminum, silver, gold, titanium nitride or tungsten.

The present application provides a manufacturing method of a semiconductor device. Firstly, a gate trench and a source trench are formed simultaneously in the same etching process, a p-type semiconductor layer and a p-type doped region can be contacted in a self-aligned manner in the source trench, and the process is simple. Secondly, a first insulating layer and a first gate are formed in a lower part of the gate trench, and a second insulating layer and a second gate are formed in an upper part of the gate trench so that the thick first insulating layer can protect the second gate from being easily broken down, the first gate can increase an electric field near a bottom of the gate trench, and thus a voltage withstand level of the semiconductor device can be improved. Thirdly, a bottom of the source trench can penetrate deep into a second n-type semiconductor layer, and the p-type doped region under the source trench can increase an electric field near the bottom of the source trench, limit the highest electric field in the semiconductor device to near the bottom of the source trench, protect the second gate in the gate trench from being easily broken down, and improve the voltage withstand level of the semiconductor device.

DETAILED DESCRIPTION

Figure 1:
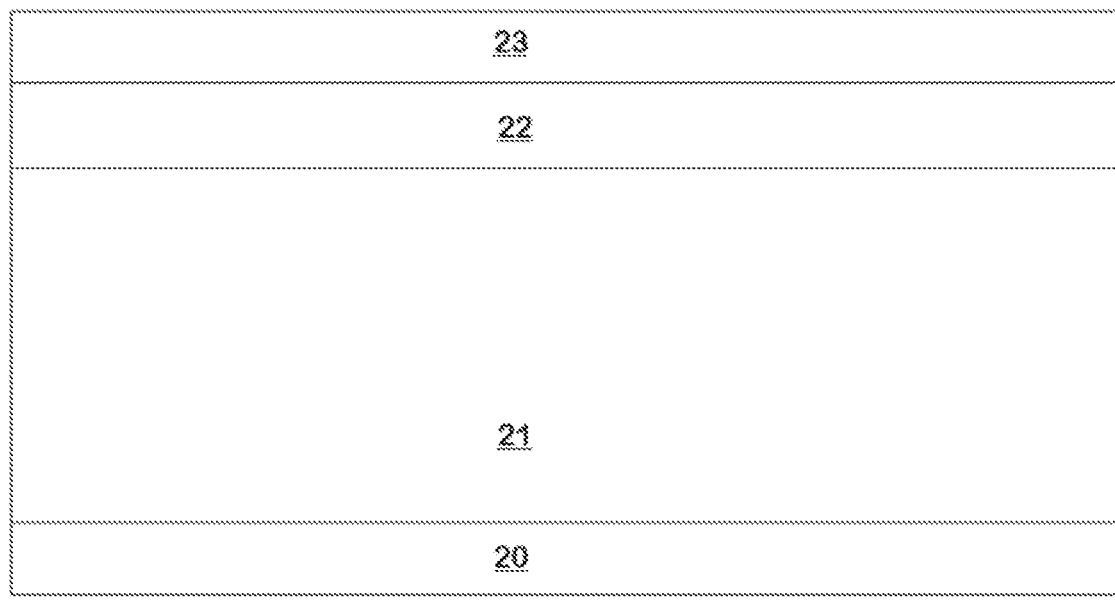
FIGS. 1 to 7 are sectional views illustrating main technical nodes of a manufacturing process of a manufacturing method of a semiconductor device according to an embodiment of the present application.

Technical solutions of the present application are described completely hereinafter in conjunction with the drawings in embodiments of the present application. It is to be understood that the terms used in the present application such as "provided", "comprising" and "including" do not exclude the presence of one or more other components or combinations thereof. Meanwhile, to illustrate the embodiments of the present application clearly, in the schematic views illustrated in the DRAWINGS, thicknesses of layers and regions described in the present application are enlarged, and dimensions illustrated in the views do not represent the actual dimensions.

FIGS. 1 to 7 are sectional views illustrating main technical nodes of a manufacturing process of a manufacturing method of a semiconductor device according to an embodiment of the present application. Firstly, as shown in FIG. 1, a semiconductor substrate is provided. The semiconductor substrate includes a first n-type semiconductor layer 20, a second n-type semiconductor layer 21, a p-type semiconductor layer 22 and a third n-type semiconductor layer 23, where the first n-type semiconductor layer 20, the second n-type semiconductor layer 21, the p-type semiconductor layer 22 and the third n-type semiconductor layer 23 are sequentially stacked, and the first n-type semiconductor layer 20 is used as an n-type drain region of the semiconductor device. In an embodiment of the present application, the first n-type semiconductor layer 20, the second n-type semiconductor layer 21, the p-type semiconductor layer 22 and the third n-type semiconductor layer 23 are all silicon carbide layers.

Figure 2:
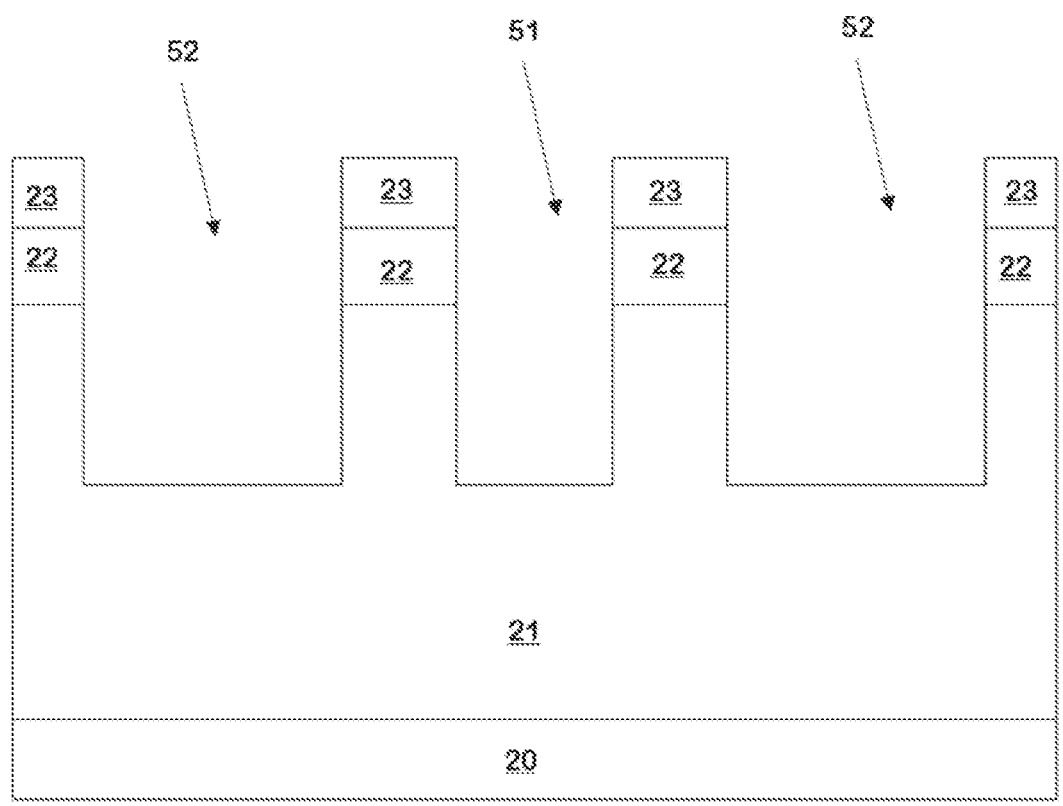

Next, as shown in FIG. 2, photolithography and etching are performed so that a gate trench 51 and a source trench 52 are formed simultaneously in the semiconductor substrate, where the gate trench 51 and the source trench 52 are alternately spaced apart, a bottom of the gate trench 51 and a bottom of the source trench 52 are both disposed in the second n-type semiconductor layer 21, and a width of the source trench 52 is greater than a width of the gate trench 51. The number of gate trenches 51 and the number of source trenches 52 are determined by the specification of the designed semiconductor device. In the embodiments of the present application, only one gate trench 51 and two source trenches 52 are shown as an example.

The p-type semiconductor layer 22 between the gate trench 51 and the source trench 52 is used as a p-type body region of the semiconductor device, and the third n-type semiconductor layer 23 between the gate trench 51 and the source trench 52 is used as an n-type source region of the semiconductor device.

Figure 3:
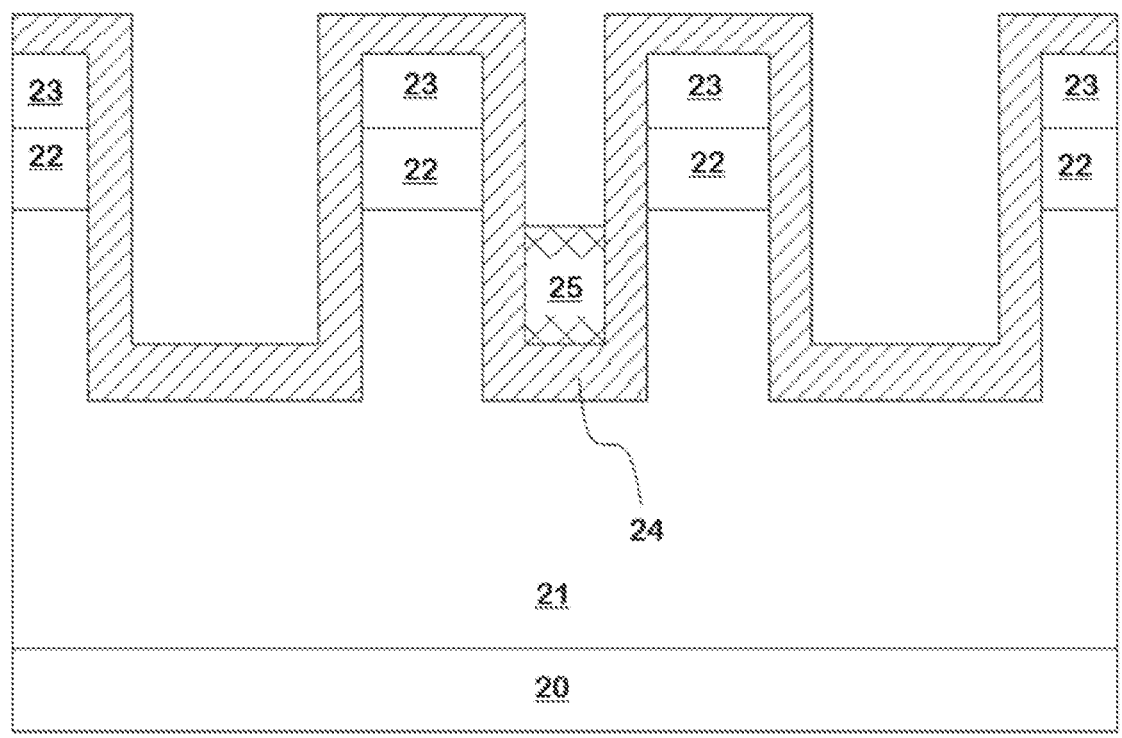

Next, as shown in FIG. 3, a first insulating layer 24 is formed and should cover an inner wall of the gate trench 51 and cover an inner wall of the source trench 52. In an embodiment of the present application, a material of the first insulating layer 24 is silicon oxide and formed through a deposition process. A first conductive layer is formed and etched back, where a remaining first conductive layer after etching forms a first gate 25 in the gate trench 51. In an embodiment of the present application, the first conductive layer is conductive polysilicon. Since the width of the source trench 52 is greater than the width of the gate trench 51, when the first conductive layer is formed, the first conductive layer may fill the gate trench 51 but not the source trench 52. Therefore, when the first conductive layer is etched, the first conductive layer in the source trench 52 may be directly etched off through an anisotropic etching method, and part of the first conductive layer remained in the gate trench 51 forms the first gate 25. In FIG. 3, an upper surface of the first gate 25 is lower than a lower surface of the p-type semiconductor layer 22, but the present application does not limit the positional relationship between the upper surface of the first gate 25 and the lower surface of the p-type semiconductor layer 22.

Figure 4:
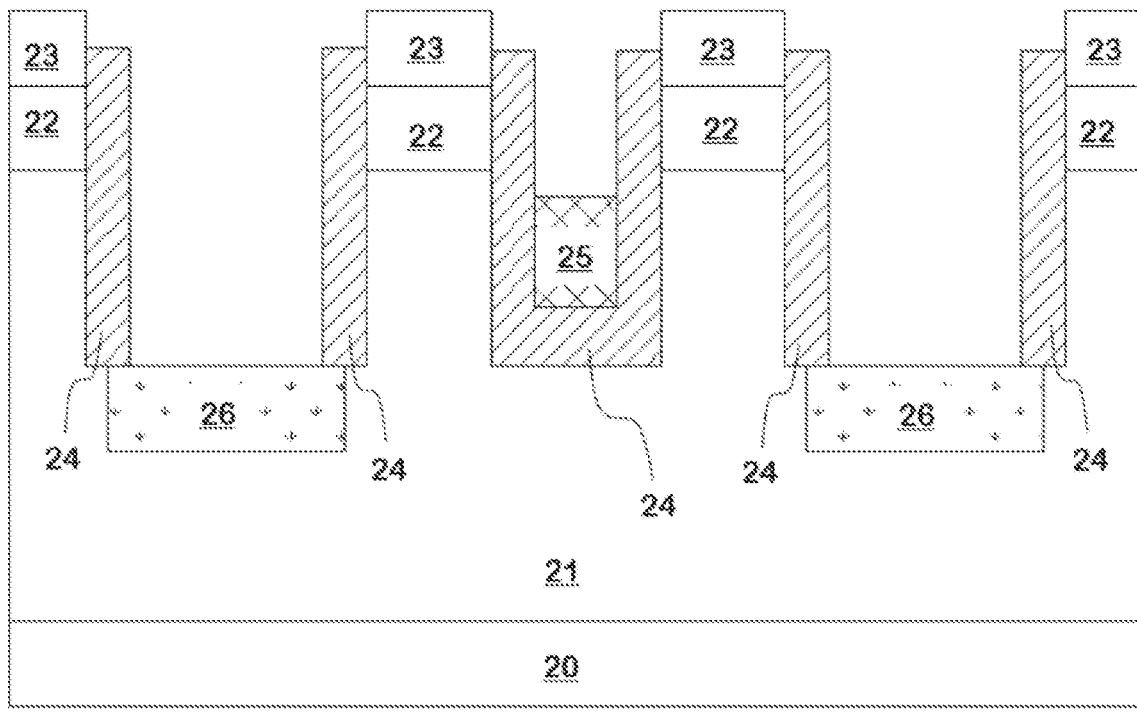

Next, as shown in FIG. 4, the anisotropic etching is performed on the first insulating layer 24 so that the second n-type semiconductor layer 21 under the source trench 52 is exposed; then p-type ion implantation is performed so that a p-type doped region 26 under the source trench 52 is formed in the second n-type semiconductor layer 21. In FIG. 4, an upper surface of a remaining first insulating layer 24 after etching is higher than an upper surface of the p-type semiconductor layer 22. In an embodiment of the present application, the upper surface of the remaining first insulating layer 24 after etching may also be lower than the upper surface of the p-type semiconductor layer 22, or the upper surface of the remaining first insulating layer 24 after etching is at the same position as the upper surface of the p-type semiconductor layer 22.

Figure 5:
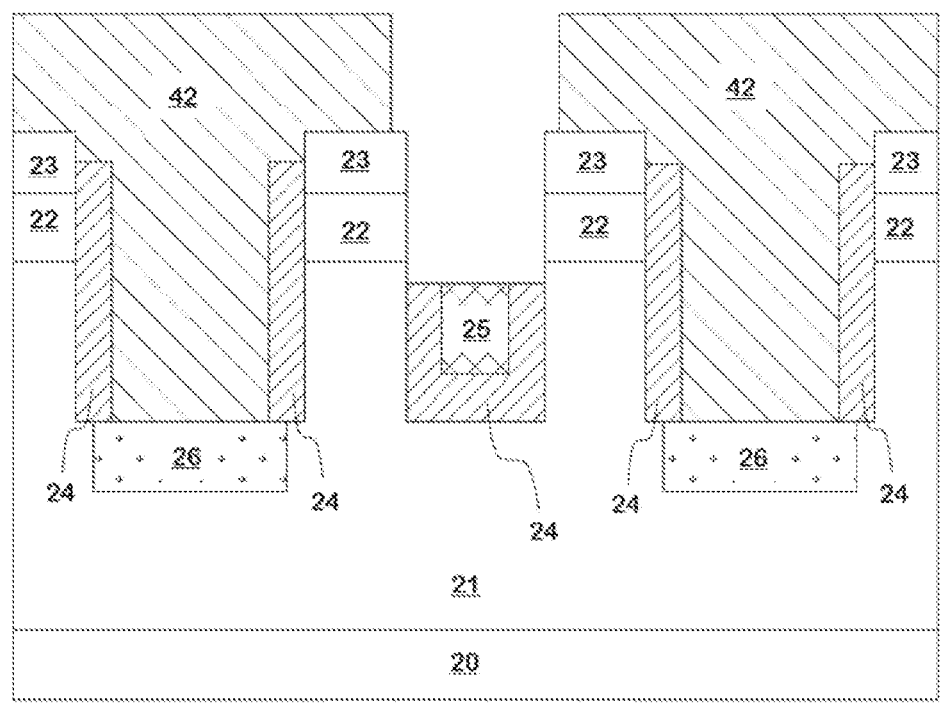

Next, as shown in FIG. 5, a layer of photoresist 42 is deposited, the gate trench 51 is exposed through a photolithography process, and then the first insulating layer 24 in the gate trench 51 is etched so that the upper surface of the first insulating layer 24 remained in the gate trench 51 is not higher than the lower surface of the p-type semiconductor layer 22.

Figure 6:
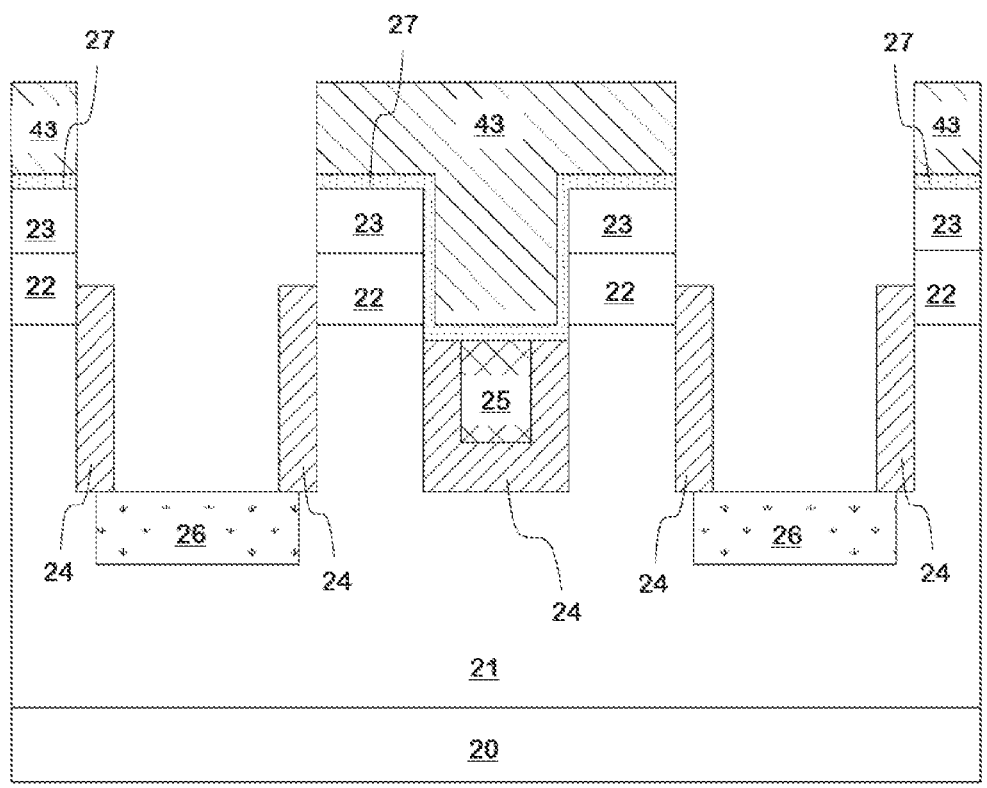

Next, as shown in FIG. 6, a second insulating layer 27 is formed after the photoresist 42 is removed, then a layer of photoresist 43 is deposited, the source trench 52 is exposed through the photolithography process, and then the second insulating layer in the source trench 52 is etched so that the second insulating layer in the source trench 52 is removed. After that, the anisotropic etching is performed on the first insulating layer 24 in the source trench 52 so that the p-type semiconductor layer 22 is exposed at a sidewall position of the source trench 52. In an embodiment of the present application, when the anisotropic etching is performed on the first insulating layer 24 and the second n-type semiconductor layer 21 under the source trench 52 is exposed, if the p-type semiconductor layer 22 is exposed at the sidewall position of the source trench 52, then after the second insulating layer in the source trench 52 is removed, the first insulating layer in the source trench 52 may not be etched. The second insulating layer 27 is used as a gate dielectric layer of the semiconductor device, a thickness of the second insulating layer 27 may be less than a thickness of the first insulating layer 24, and a material of the second insulating layer 27 may be at least one of silicon oxide, silicon nitride, silicon oxynitride or hafnium oxide or may be another insulating medium with a high dielectric constant.

Figure 7:
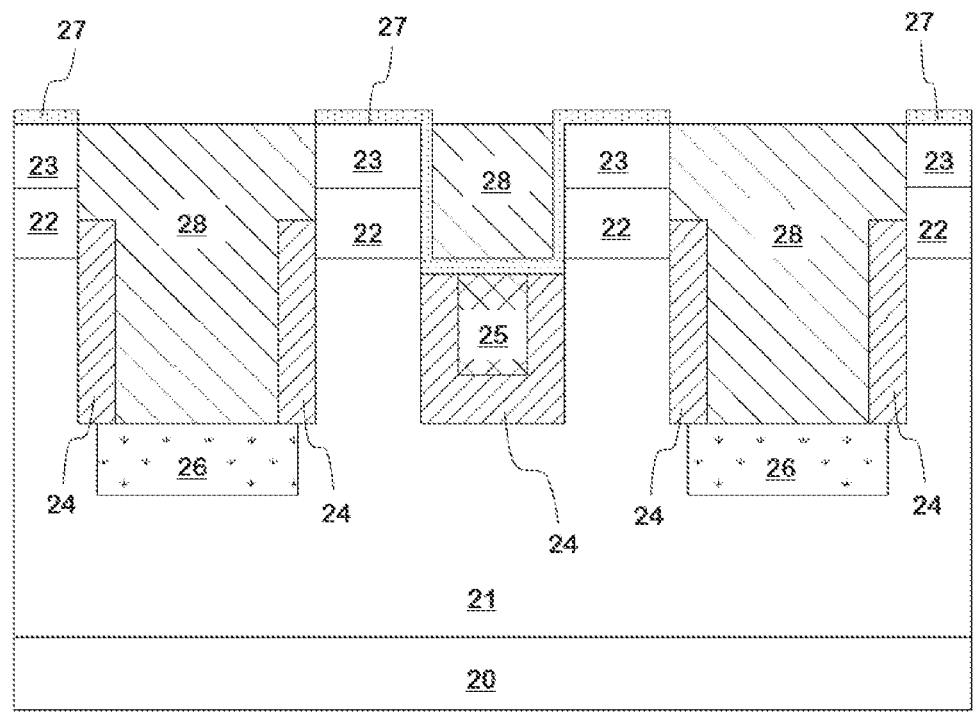

Next, as shown in FIG. 7, a second conductive layer 28 is formed and etched, where a remaining second conductive layer 28 after etching forms a second gate in the gate trench 51 and forms a source in the source trench 52. In an embodiment of the present application, a material of the second conductive layer 28 is at least one of titanium, nickel, copper, aluminum, silver, gold, titanium nitride or tungsten. Since the p-type semiconductor layer 22 and the p-type doped region 26 are exposed in the source trench 52, thus when the second conductive layer 28 is formed, the second conductive layer 28 may be in contact with the p-type semiconductor layer 22, the third n-type semiconductor layer 23 and the p-type doped region 26 in a self-aligned manner.

Figure 8:
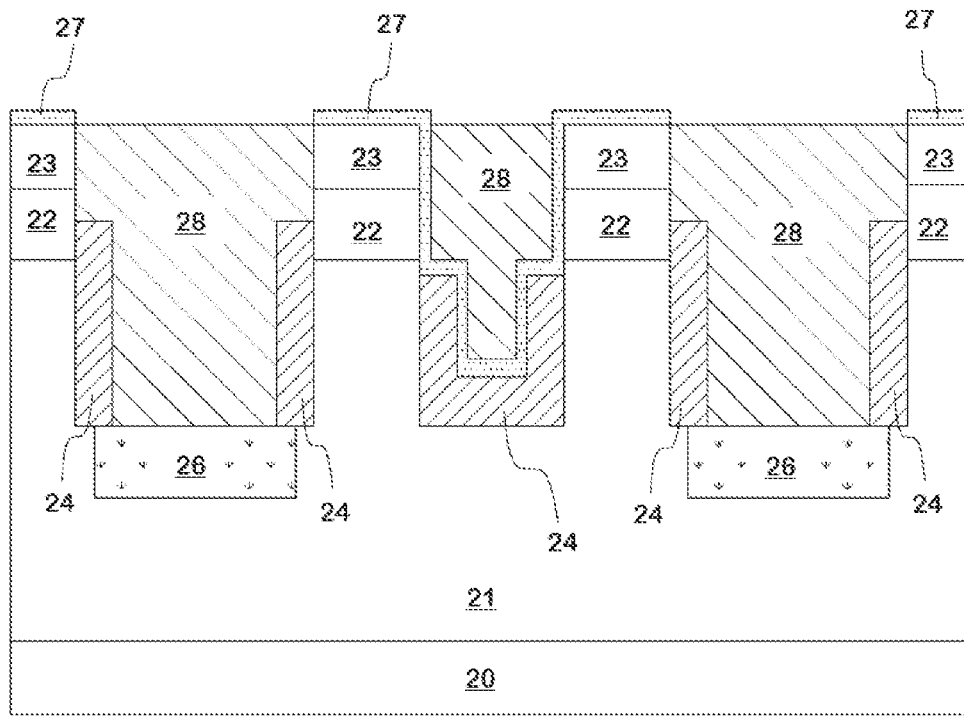
FIG. 8 is a sectional view of a semiconductor device manufactured through a manufacturing method of a semiconductor device according to another embodiment of the present application.

In the manufacturing method of a semiconductor device provided in the present application, before the second insulating layer 27 is formed, the first gate in the gate trench 51 may be etched off, then the second insulating layer 27 is formed, finally, the second conductive layer 28 is formed. The structure of the semiconductor device formed by these steps is shown in FIG. 8.

What is claimed is:

1. A manufacturing method of a semiconductor device, comprising:
    providing a semiconductor substrate, wherein the semiconductor substrate comprises a first n-type semiconductor layer, a second n-type semiconductor layer, a p-type semiconductor layer and a third n-type semiconductor layer which are stacked in turn;
    performing photolithography and etching to simultaneously form a gate trench and a source trench in the semiconductor substrate, wherein the gate trench and the source trench are alternately spaced apart, a bottom of the gate trench and a bottom of the source trench are both disposed in the second n-type semiconductor layer, and a width of the source trench is greater than a width of the gate trench;
    forming a first insulating layer covering an inner wall of the gate trench and covering an inner wall of the source trench;
    forming a first conductive layer and etching back the first conductive layer, wherein a remaining first conductive layer after etching forms a first gate in the gate trench;
    performing anisotropic etching on the first insulating layer to expose the second n-type semiconductor layer under the source trench;
    performing p-type ion implantation to form a p-type doped region under the source trench in the second n-type semiconductor layer;
    etching the first insulating layer in the gate trench so that an upper surface of the first insulating layer in the gate trench is not higher than a lower surface of the p-type semiconductor layer;
    forming a second insulating layer, and etching the second insulating layer to remove a part of the second insulating layer, wherein the part of the second insulating layer is disposed in the source trench; and
    forming a second conductive layer, and etching the second conductive layer so that a remaining part of the second conductive layer after etching forms a second gate in the gate trench and forms a source in the source trench.

2. The manufacturing method of claim 1, wherein the first n-type semiconductor layer, the second n-type semiconductor layer, the p-type semiconductor layer and the third n-type semiconductor layer are all silicon carbide layers.

3. The manufacturing method of claim 1, wherein when the first conductive layer is formed, the first conductive layer fills the gate trench but not the source trench.

4. The manufacturing method of claim 1, further comprising:
    etching off the first gate in the gate trench before forming the second insulating layer.

5. The manufacturing method of claim 1, further comprising:
    after removing the part of the second insulating layer in the source trench, continuing to perform the anisotropic etching on the first insulating layer in the source trench to expose the p-type semiconductor layer at a sidewall position of the source trench.

6. The manufacturing method of claim 1, wherein a thickness of the first insulating layer is greater than a thickness of the second insulating layer.

7. The manufacturing method of claim 1, wherein a material of the first insulating layer is silicon oxide.

8. The manufacturing method of claim 1, wherein a material of the second insulating layer is at least one of silicon oxide, silicon nitride, silicon oxynitride or hafnium oxide.

9. The manufacturing method of claim 1, wherein a material of the first insulating layer is conductive polysilicon.

10. The manufacturing method of claim 1, wherein a material of the second conductive layer is at least one of titanium, nickel, copper, aluminum, silver, gold, titanium nitride or tungsten.

* * * * *